United States Patent [19]
Sasaki

[11] Patent Number: 5,497,128
[45] Date of Patent: Mar. 5, 1996

[54] LOCAL OSCILLATOR SYSTEM AND FREQUENCY SWITCHING METHOD FOR MINIMIZING SPURIOUS COMPONENTS

[75] Inventor: Yutaka Sasaki, Tokyo, Japan

[73] Assignee: NEC Corporation, Japan

[21] Appl. No.: 132,043

[22] Filed: Oct. 5, 1993

[30] Foreign Application Priority Data

Oct. 5, 1992 [JP] Japan .................................. 4-265690
Nov. 25, 1992 [JP] Japan .................................. 4-314768

[51] Int. Cl.$^6$ .......................... H03B 21/00; H03B 21/01
[52] U.S. Cl. ........................... 331/38; 331/49; 331/77; 455/199.1; 455/255; 370/123
[58] Field of Search ........................ 331/38, 49, 77, 331/37, 39, 40, 41, 42, 43; 455/255, 318, 196.1, 197.1, 199.1; 370/69.1, 76, 123, 124

[56] References Cited

U.S. PATENT DOCUMENTS

| | | | |
|---|---|---|---|
| 3,332,038 | 7/1967 | Stanley et al. | 370/69.1 |
| 3,379,992 | 4/1968 | Hoo | 331/38 |
| 4,659,999 | 4/1987 | Motoyama et al. | 331/49 X |

FOREIGN PATENT DOCUMENTS 3133547  8/1982  Germany .
2218870  11/1989  United Kingdom .

OTHER PUBLICATIONS

Patent Abstracts of Japan, JP 60 229 535, vol. 10, No. 87 (E-393) (2144) Apr. 5, 1986.

*Primary Examiner*—Siegfried H. Grimm
*Attorney, Agent, or Firm*—Ostrolenk, Faber, Gerb & Soffen

[57] ABSTRACT

A local oscillator system carries out a frequency switching method, in which local signals with fewer spurious components can be obtained. The local oscillator system is provided with frequency generators for generating signals with different frequencies and frequency dividers connected to the frequency generators. The dividers divide the frequency of the signals to output the frequency-divided signals while operating in an active mode and output undivided signals while the dividers are operating in inactive mode. The dividers are controlled so that one of the dividers is in the active mode and the remaining dividers are in the inactive mode. The output signals from the dividers are combined with each other to form a single output signal and then the single output signal is sent to a filter. The filter selects a component having a desired local frequency from the single output signal. Spurious components caused by unselected frequencies are removed by the filter because they are not divided.

23 Claims, 5 Drawing Sheets

LOCAL OSCILLATOR SYSTEM AND FREQUENCY SWITCHING METHOD FOR MINIMIZING SPURIOUS COMPONENTS

BACKGROUND OF THE INVENTION

1. Field of the Invention

The present invention relates to a local oscillator system for radio-frequency (RF) communication systems and a frequency switching method of the oscillator system, and more particularly, to a local oscillator system for RF communication systems with frequency generators each of which generates a plurality of frequencies different from each other, and a frequency switching method of the local oscillator system.

2. Description of the Prior Art

Figure 1:
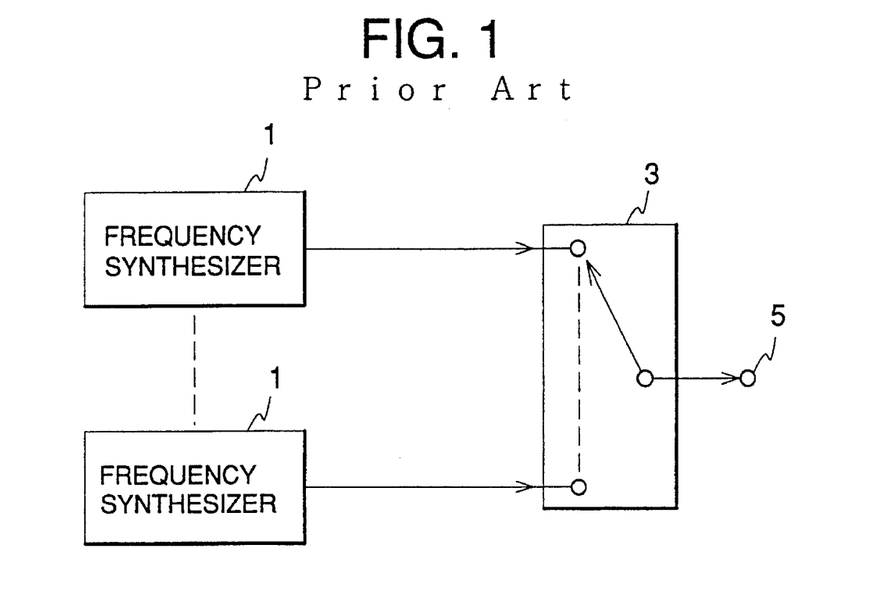
FIG. 1 is a functional block diagram of a conventional local oscillator system.

FIG. 1 is a functional block diagram for showing a frequency switching method of a conventional local oscillator system.

In FIG. 1, there are provided a plurality of phase-locked loop (PLL) frequency synthesizers 1, each of which generates a plurality of frequencies from a single reference frequency, and a switch circuit 3 which selects one of a plurality of local signals with a respective frequency to send it to an output terminal 5. Each of the synthesizers 1 sends one of the frequencies generated to the switch circuit 3, and the frequencies sent from all the PLL synthesizers 1 are different from each other and belong to the same band of frequencies. The switch circuit 3 is generally composed of pin diodes for high-speed switching.

With the conventional frequency switching method, the circuit configuration of the local oscillator system is simple, however, there are several problems. A first problem is that all the synthesizers 1 operate simultaneously and isolation between input and output ends of the switch circuit 3 is not sufficient for such frequencies, so that the frequencies not selected by the switch circuit 3 are sent to the output terminal 5 as spurious components.

The reason is that the unwanted or spurious frequencies are easily sent to the output terminal 5 at such high frequencies because the pin diode used in the switch circuit 3 performs its switching operation by changing the electric resistance between its input and output ends and the isolation characteristic between these ends becomes degraded as the input frequency becomes higher.

Since all the frequencies generated by the respective synthesizers 1 belong to the same band of frequencies, it is not possible to remove the spurious components by using ordinary elements such as bandpass filters. As a result, when the tolerance for the spurious components is strict, the conventional frequency switching method shown in FIG. 1 is difficult to be applied to such a conventional local oscillator system.

To solve the problem of spurious components, a pin diode adapted to provide sufficient isolation between the input and output ends at high frequencies may be employed in the switch circuit 3. However, such a pin diode is very expensive, resulting in high fabrication costs.

The second problem with the above-mentioned conventional method is that whenever the local frequencies to be outputted are changed by the switch circuit 3, the loads of the respective synthesizers 1 vary momentarily to cause fluctuation in the frequencies out from the synthesizers 1. As a result, the frequency switching operation is not completed until the fluctuation of the frequencies has stopped. This means that the switching time is made long and a quick switching operation is impossible.

Figure 2:
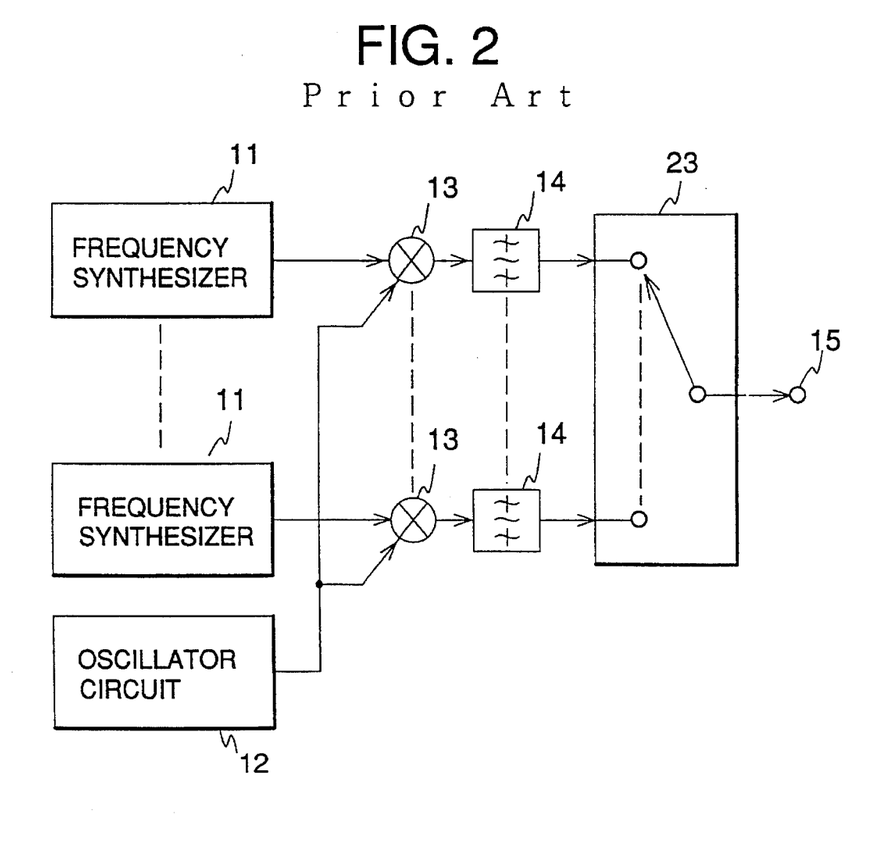
FIG. 2 is a functional block diagram of another conventional local oscillator system.

FIG. 2 is a block diagram for showing another conventional frequency switching method of a local oscillator system, in which PLL frequency synthesizers 11, a fixed-frequency oscillator circuit 12, frequency mixer circuits 13, bandpass filters 14 and a switch circuit 23 are provided.

Each of the PLL frequency synthesizers 11 generates first signals with different frequencies belonging to the same band of frequencies and outputs one of them to the corresponding mixer circuit 13. The oscillator circuit 12 generates a second signal with a single, fixed frequency and outputs it to all the mixer circuits 13.

The frequencies from the synthesizers 11 and the fixed frequency from the oscillator 12 have the following relationship. The sums or differences between each of the frequencies from the synthesizers 11 and the fixed frequency from the oscillator 12 are equal to desired local frequencies.

Each of the mixer circuits 13 mixes in frequency the first signal output from the corresponding synthesizer 11 and the second signal output from the oscillator circuit 12 to send it to the corresponding bandpass filter 14, resulting in a signal having the sum and difference of the frequencies output from the corresponding synthesizer 11 and the oscillator circuit 12.

Each of the filters 14 removes a component with an undesired frequency, for example, the sum frequency, from the output signal of the corresponding mixer circuit 13 and transmits a component with a desired frequency, for example, the difference frequency, to the switch circuit 23. The spurious components from the mixer circuits 13 are removed by the corresponding filters 14, respectively.

The switch circuit 23 selects one of the output signals with the different frequencies from the bandpass filters 14 and sends it to the output terminal 15 as a desired local signal, similar to the case as shown in FIG. 1.

Thus, with the conventional method shown in FIG. 2, the signals with the desired frequencies are sent to the switch circuit 23 after their spurious components have been removed, so that the first problem can be solved. In addition, since the switch circuit 23 is electrically connected to the frequency synthesizers 11 through the corresponding frequency mixer circuits 13 and bandpass filters 14, respectively, the loads of synthesizers 11 do not vary momentarily whenever the local frequency is changed and as a result, the fluctuation of the local frequencies taken out from the output end 15 can be cancelled. This means that the above-mentioned second problem can be also solved.

Yet, with the method shown in FIG. 2, when the input frequencies are higher and the tolerance for the spurious components is strict, the above-mentioned first problem related to the spurious components remains unsolved due to insufficient isolation between the input and output ends of the switch circuit 23.

SUMMARY OF THE INVENTION

Accordingly, an object of the present invention is to provide a local oscillator system and an associated frequency switching method in which a local signal has fewer spurious components than the prior art, a lower fabrication cost and a simple circuit configuration.

A local oscillator system according to a first embodiment of the present invention has frequency generators for generating signals having different frequencies from each other, and frequency dividers respectively connected to the corresponding frequency generators to receive output signals from the corresponding frequency generators.

Each of the frequency dividers have an active operation mode and an inactive operation mode. In the active operation mode, the frequency dividers divide frequency of the signal output from the corresponding frequency generator by a dividing factor n (n is integer of two or more) to output a divided signal, and in the inactive operation mode, the frequency dividers output the output signal without dividing the frequency of the signal.

The frequency dividers are controlled so that one of the frequency dividers is in the active operation mode while the remaining frequency dividers are in the inactive mode.

Signals outputted from all the frequency dividers are combined with each other to generate a single output signal, and a component with a divided frequency is selected from the single output signal by a filter. A desired local signal is obtained at an output end of the filter.

With the local oscillator system of the first aspect, the frequency dividers connected to the corresponding frequency generators are controlled so that one of the frequency dividers is selected to be in the active mode, thereby dividing the output frequency from the corresponding frequency generator. Then, the filter transmits the component with the frequency obtained through division and stops the remaining components of the signal obtained without frequency division. As a result, the signal component selected by the filter is output as the local signal.

Since the remaining component or components of the output signal from the combining means is/are obtained without frequency division, these components do not belong to the passband of the filter. Thus, the spurious components caused by the remaining components of the signal also do not belong to the passband, they can also be removed by the filter.

As a result, the local signal containing fewer spurious components than the prior art can be obtained.

In addition, since expensive pin diodes are not required, the fabrication cost of the local oscillator system is low and since complicated circuits are not used, the circuit configuration is also made simple.

In a preferred embodiment, frequency multipliers are provided between the frequency dividers and the combining means, respectively. The multipliers multiply the frequency of the respective signals output from the frequency dividers by m and send them to the combining means, where m is equal to an integer of two or more.

In another preferred embodiment, a frequency multiplier is provided between the combining means and the filter. The multiplier multiplies the frequency of the signal output from the combining means by m and sends them to the filter.

A local oscillator system according to a second embodiment of the present invention has an oscillator generating a first signal with a fixed frequency of k times as much as a given frequency, where k is an integer of two or more, and frequency dividers are connected to the oscillator.

Each of the frequency dividers receives the first signal from the oscillator and divides the frequency of the first signal by a dividing factor k. The frequency dividers are controlled so that one of the frequency dividers is operating and the remaining frequency dividers are not operating.

Frequency generators generate second signals having different frequencies from each other.

The frequencies of a signal output from a corresponding one of the frequency dividers and the second signal output from a corresponding one of the frequency generators are mixed with each other.

A component with a desired local frequency is selected from an output signal of the one of the frequency mixers that corresponds to an operating one of the dividers by a corresponding one of filters. The filters are respectively connected to the frequency mixers.

With the local oscillator system of the second embodiment, the first signal with the fixed frequency of k times as much as the given frequency, which is generated by the oscillator, is distributed to all the frequency dividers and divided in frequency by k. The frequency dividers are controlled so that one of the dividers corresponding to the local frequency required is in operation, and its output signal having a frequency divided by k is frequency-mixed with the second signal from the corresponding one of the generators in the corresponding mixer.

Since the rest of the dividers are not in operation, the spurious components which are sent to the rest of the mixers have frequencies of k times as much as those to be mixed. The frequencies of the spurious components do not belong to the passbands of the filters. Therefore, the spurious components can be removed by the filters, resulting in the local signal containing fewer spurious components than the prior art.

In addition, similar to the first embodiment, the fabrication cost of the local oscillator system is low and the circuit configuration is also simple.

According to a third embodiment of the present invention, a frequency switching method of a local oscillator system is provided, in which signals having different frequencies are generated by using frequency generators. A frequency of one of the signals is divided by a dividing factor n (n is an integer of two or more), by controlling frequency dividers respectively connected to the frequency generators so that one of the frequency dividers is in an active operation mode and the rest of the frequency dividers are in an inactive operation mode.

An output signal from one of the frequency dividers, which is in an active operation mode, and an output signal or output signals from the rest of the frequency dividers, which are in an inactive operation mode, are combined with each other, thereby generating a single output signal.

A component with a frequency obtained through the dividing step is selected from the single output signal as a local signal by using a filter.

In a preferred embodiment, the frequency of the signals output from the frequency dividers are multiplied by m to be combined via the frequency multipliers, where m is an integer of two or more.

In another preferred embodiment, the frequency of the single output signal combined is multiplied by m to be sent to the filter.

With the method of the third embodiment, the same effects as those of the first embodiment can be obtained.

According to a fourth embodiment of the present invention, a frequency switching method of a local oscillator system is provided, in which a first signal with a fixed frequency of k times as much as a given frequency is generated by using an oscillator, where k is an integer of two or more. A frequency of the first signal from the oscillator is divided by a dividing factor k by using frequency dividers.

The frequency dividers are connected to the oscillator and controlled so that one of the frequency dividers is in operation and the rest of the frequency dividers are out of operation.

Second signals with different frequencies are generated by using frequency generators.

The frequencies of signals output from the frequency dividers are mixed with the frequencies of the second signals output from the corresponding frequency generators by frequency mixers. Components with desired local frequencies from the respective signals output from the frequency mixers are selected by using filters connected to the frequency mixers.

The component with the desired local frequency is derived through the one of the filters corresponding to an operating one of the frequency dividers.

With the method of the fourth embodiment, the same effects as those of the second embodiment can be obtained.

DETAILED DESCRIPTION OF THE PREFERRED EMBODIMENTS

Preferred embodiments of the present invention will be described below referring to FIGS. 3 to 6.

[First Embodiment]

Figure 3:
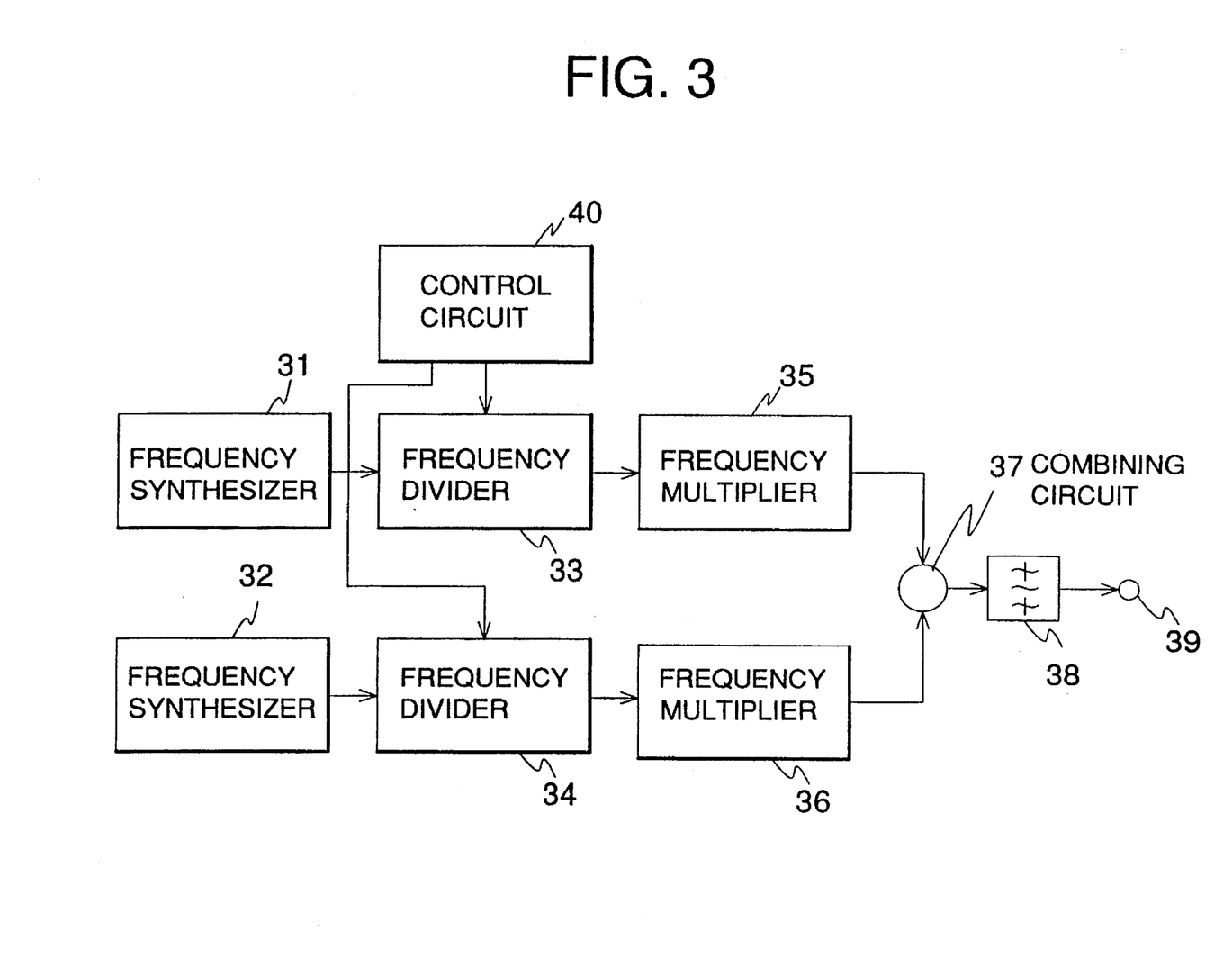
FIG. 3 is a functional block diagram of a local oscillator system according to a first embodiment of the present invention.

As shown in FIG. 3, a local oscillator system for an RF communication system according to a first embodiment of the present invention is composed of first and second PLL frequency synthesizers 31 and 32, first and second frequency dividers 33 and 34, a control circuit 40 for controlling the first and second frequency dividers 33 and 34, frequency multipliers 35 and 36, a combining circuit 37 and a bandpass filter 38.

The first PLL frequency synthesizer 31 generates a signal with a variable frequency $(n/m)f_1$ which is $(n/m)$ times in value as much as a frequency $f_1$ to send it to the first frequency divider 33, where $n \neq m$ and n and m are integers of two (2) or more, respectively. The second PLL frequency synthesizer 32 generates a signal with a variable frequency $(n/m)f_2$ which is $(n/m)$ times in value as much as a frequency $f_2$ to send it to the second frequency divider 34. These frequencies $f_1$ and $f_2$ are different in value from each other and belong to the same band of frequencies.

The first frequency divider 33 receives an output signal with a frequency $(n/m)f_1$ from the first synthesizer 31 and divides the frequency of the output signal by a dividing factor n in an active operation mode; then sends an output signal with a frequency $(1/m)f_1$ obtained by dividing the frequency $(n/m)f_1$ by n to the first frequency multiplier 35. Similarly, the second frequency divider 34 receives an output signal with a frequency $(n/m)f_2$ from the second synthesizer 32 and divide the frequency of the output signal by a dividing factor n in an active operation mode; then sends an output signal with a frequency $(1/m)f_2$ obtained by dividing the frequency $(n/m)f_2$ by n to the second frequency multiplier 36.

In an inactive operation mode, the first and second frequency dividers 33 and 34 receive the signals output from the first and second synthesizers 31 and 32, and then send them to the first and second frequency multipliers 35 and 36 without performing frequency division or changing the frequencies of the signals. Therefore, in the inactive operation mode, the output signals from the first and second frequency dividers 33 and 34 have frequencies $(n/m)f_1$ and $(n/m)f_2$, respectively.

The control circuit 40 controls the frequency dividers 33 and 34 so that one of the dividers 33 and 34 is in the active operation mode while the other is in the inactive operation mode.

The first frequency multiplier 35 receives the output signal from the first divider 33 and multiplies the frequency of the output signal by a multiplication factor m, then sends an output signal to the combining circuit 37. Similarly, the second frequency multiplier 36 receives the output signal from the second divider 34 and multiplies the frequency of the output signal by a multiplication factor m, then sends an output signal to the combining circuit 37. Therefore, the output signal output from the first frequency multiplier 35 has a frequency $f_1$ or $nf_1$, and the output signal from the second frequency multiplier 36 has a frequency $f_2$ or $nf_2$.

The combining circuit 37 receives the output signals from the first and second multipliers 35 and 36 and combines them to generate a single output signal containing the frequency components of both output signals, and then sends the single output signal to the bandpass filter 38.

Since the first and second frequency dividers 33 and 34 are controlled by the control circuit 40 so that one of the dividers 33 and 34 is in the active operation mode while the other is in the inactive operation mode, the output signal from the combining circuit 37 contains components with frequencies $f_1$ and $nf_2$ in one case, and with frequencies $f_2$ and $nf_1$ in another case.

The bandpass filter 38 selectively transmits the components of the output signal with the frequencies $f_1$ and $f_2$, and stops the components thereof with the frequencies $nf_1$ and $nf_2$. Since n is an integer of two (2) or more, such a setup is possible. Then, the component with the frequency $f_1$ or $f_2$ thus transmitted is selectively sent to an output terminal 39 as a local signal with a desired frequency.

Preferably, cut-off frequencies of the bandpass filter 38 are set up as follows:

In the case of n<m, the upper cut-off frequency is set so that signal components with the frequencies of $(n/m)f_1$ or less and $(n/m)f_2$ or less are removed from the signal, and the lower cut-off frequency is set so that those with the frequencies of $(2n/m)f_1$ or more and $(2n/m)f_2$ or more are removed from the signal. For example, if n=2 and m= 3, signal components with the frequencies of $(2/3)f_1$ or less and $(2/3)f_2$ or less are removed and those with the frequencies of $(4/3)f_1$ or more and $(4/3)f_2$ or more are removed.

In the case of n>m, the upper cut-off frequency is set so that signal components with the frequencies of $(n/m)f_1$ or more and $(n/m)f_2$ or more are removed. The lower cut-off frequency is not required to be set; then, a low-pass filter may be used.

Next, a frequency switching method of the local oscillator system with the above-mentioned configuration is described below.

When a local signal with the frequency $f_1$ is output from the output terminal 39, the first frequency divider 33 is controlled to be put into the active operation mode and the second frequency divider 34 is put into the inactive operation mode.

The signal with the frequency $(n/m)f_1$ generated in the first frequency synthesizer 31 is sent to the first frequency divider 33 and is divided in frequency by n to send a resulting frequency-divided signal to the first frequency multiplier 35. The output signal from the first divider 33 has the frequency $(1/m)f_1$.

The signal with the frequency $(n/m)f_2$ generated in the second frequency synthesizer 32 is sent to the second frequency divider 34 and is sent to the second frequency multiplier 36 without frequency division. Therefore, the output signal from the second divider 34 has the frequency $(n/m)f_2$.

The first frequency multiplier 35 multiplies the frequency of the signal output from the first frequency divider 33. Then, a signal with the frequency $f_1$ output from the multiplier 35 is sent to the combining circuit 37. Similarly, the second frequency multiplier 36 multiplies the frequency of the signal output from the second frequency divider 34. Then, a signal with the frequency $nf_2$ output from the multiplier 36 is sent to the combining circuit 37.

The output signals from the first and second multipliers 35 and 36 are combined with each other to form a single output signal containing the components with the frequencies $f_1$ and $nf_2$ in the combining circuit 37.

As mentioned above, the bandpass filter 38 only transmits the components with the frequency $f_1$ and $f_2$, so that in this case, only the signal component with the frequency $f_1$ is selected to be transmitted to the output terminal 39. Thus, a local signal with the desired frequency $f_1$ can be obtained.

A local signal with the frequency $f_2$ can be removed in the same sequence. In this case, the second frequency divider 34 is put into the active operation mode and the first frequency divider 33 is put into the inactive operation mode by the control circuit 40.

The signal with the frequency $(n/m)f_1$ is sent to the first frequency divider 33 and is sent to the first frequency multiplier 35 without frequency division. The output signal from the first divider 33 has the frequency $(n/m)f_1$.

The signal with the frequency $(n/m)f_2$ is sent to the second frequency divider 34 and divided in frequency by n to send a resulting frequency-divided signal to the second frequency multiplier 36. The output signal from the second divider 33 has the frequency $(1/m)f_2$.

The frequency of the signal with the frequency $(n/m)f_1$ output from the first divider 33 is multiplied by m in the first multiplier 35 to send a resulting frequency-multiplied signal to the combining circuit 37. The output signal from the first multiplier 35 has the frequency $nf_1$.

Similarly, the frequency of the signal with the frequency $(1/m)f_2$ output from the second divider 34 is multiplied by m in the second multiplier 36 to send a resulting frequency-multiplied signal to the combining circuit 37. The output signal of the second multiplier 36 has the frequency $f_2$.

The signals output from the first and second multipliers 35 and 36 are combined with each other to form a single output signal containing the components with the frequencies $nf_1$ and $f_2$ in the combining circuit 37.

Only the signal component with the frequency $f_2$ is selected to be transmitted to the output terminal 39 by the bandpass filter 38. Thus, a local signal with the desired frequency $f_2$ can be obtained.

As described above, with the frequency switching method of the first embodiment, the first and second frequency dividers 33 and 34 are controlled so that one of the dividers 33 and 34 is put in the active operation mode, thereby obtaining the combined output signal with the component of the frequencies $nf_1$ and $f_2$ or that of the frequencies $nf_2$ and $f_1$. Then, the component of the frequencies $f_1$ or $f_2$ is selected by the filter 38 to be sent to the output terminal 39.

As a result, the local frequency can be switched by changing the operation modes of the first and second frequency dividers 33 and 34.

Since the component not selected has the frequency $nf_1$ or $nf_2$, the spurious component generated in the combining circuit 37 has the same frequency $nf_1$ or $nf_2$; thus the spurious component can be removed by the filter 38. This means that local frequencies having fewer spurious components than the prior art can be obtained.

In addition, since expensive pin diodes are not required to form a switch circuit and complicated circuits are unnecssary, the fabrication cost of the local oscillator system is low and the circuit configuration thereof is simple.

[Second Embodiment]

Figure 4:
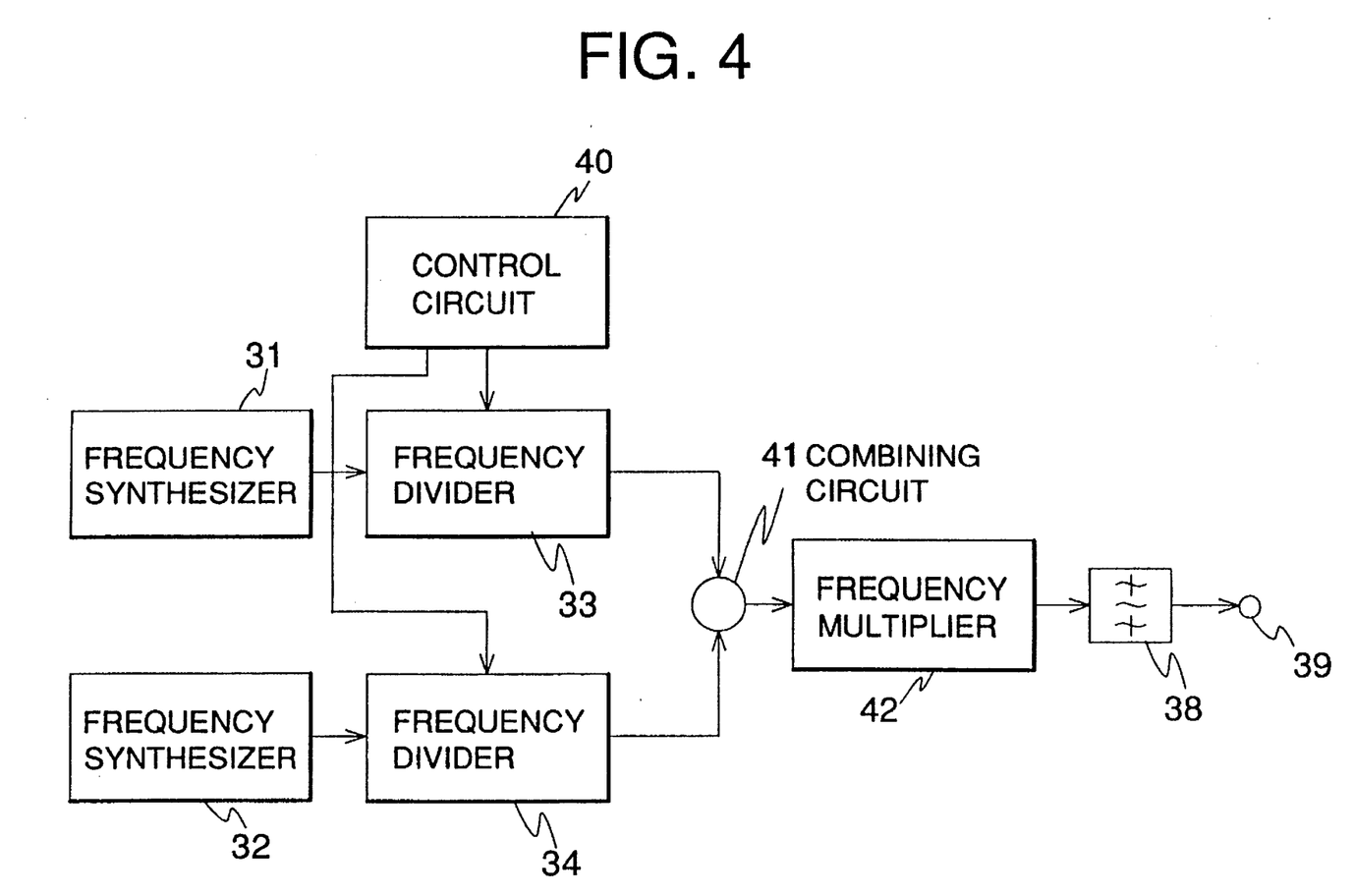
FIG. 4 is a functional block diagram of a local oscillator system according to a second embodiment of the present invention.

A local oscillator system for an RF communication system according to a second embodiment is shown in FIG. 4. The local oscillator system of the second embodiment has the same configuration as that of the first embodiment except that the output signals from the second frequency dividers 33 and 34 are combined with each other to form a single output signal prior to frequency multiplication and then the signal frequency of the single output is multiplied.

Therefore, for the sake of simplification of explanation, the same reference numbers as those in FIG. 3 are used to label the corresponding elements in FIG. 4, and description about them is omitted.

In FIG. 4, as stated above in the first embodiment, the first and second frequency dividers 33 and 34 divide the frequency of input signals by the dividing factor n while in the active operation mode, and do not divide the input signals while in the inactive operation mode.

A combining circuit 41 combines the signals output from the first and second frequency dividers 33 and 34 with each other to form a single output signal including the components with both frequencies; then the single output signal is sent to a frequency multiplier 42.

The first and second frequency dividers 33 and 34 are controlled so that one of them is in the active operation mode while the other is in the inactive operation mode, so that the signal output from the combining circuit 41 includes the components with the frequencies $(1/m)f_1$ and $(n/m)f_2$ in one case, and with those $(n/m)f_1$ and $(1/m)f_2$ in another case.

The frequency multiplier 42 receives the output signal from the combining circuit 41 and multiplies the frequency of the output signal by m to send a signal obtained by frequency multiplication to the bandpass filter 38. Therefore, the signal output from the multiplier 42 includes the components with the frequencies $f_1$ and $nf_2$ in one case, and with the frequencies $nf_1$ and $f_2$ in another case.

The bandpass filter 38 has a function that the components with the frequencies $f_1$ and $f_2$ are transmitted and the frequencies $nf_1$ and $nf_2$ are removed, so that the output signal from the filter 38 includes the component with the frequency $f_1$ or $f_2$, which is sent to the output terminal 39 as a desired local signal.

Next, a frequency switching method of the local oscillator system of the second embodiment is explained.

When a local signal with the frequency $f_1$ is taken out from the output terminal 39, the first frequency divider 33 is put into the active operation mode and the second frequency divider 34 is put into the inactive operation mode by the control circuit 40.

The signal with the frequency $(n/m)f_1$ from the first frequency synthesizer 31 is sent to the first frequency divider 33 and is divided by n to send a resulting frequency-divided signal to the combining circuit 41. The signal output from the first divider 33 has the frequency $(1/m)f_1$. On the other hand, the signal with the frequency $(n/m)f_2$ output from the second frequency synthesizer 32 is sent to the second frequency divider 34 and is sent to the combining circuit 41 without frequency division. The signal output from the second divider 34 has the same frequency $(n/m)f_2$ as that in the second synthesizer 32.

The signals output from the first and second dividers 33 and 34 are combined with each other to form the single output signal containing the components with the frequencies $(1/m)f_1$ and $(n/m)f_2$ in the combining circuit 37. The signal obtained through combination is then sent to the frequency multiplier 42 to multiply the frequency of the signal by m, resulting in the output signal having the frequencies $f_1$ and $nf_2$. The output signal thus obtained is then sent to the bandpass filter 38.

The bandpass filter 38 only transmits the components with the frequency $f_1$ and $f_2$, so that only the signal component with the frequency $f_1$ is selected to be transmitted to the output terminal 39. Thus, a local signal with the frequency $f_1$ can be obtained.

A local signal with the frequency $f_2$ can be taken out in the same sequence. In this case, the first frequency divider 33 is put into the inactive operation mode and the second frequency divider 34 is put into the active operation mode.

In the combining circuit 41, the output signals with the frequencies $(n/m)f_1$ and $(1/m)f_2$ from the first and second dividers 33 and 34 are combined with each other to form a single output signal containing both components.

The frequency of the signal with the frequencies $(n/m)f_1$ and $(1/m)f_2$ output from the combining circuit 41 is multiplied by m in the multiplier 42 to send a resulting frequency-multiplied signal to the bandpass filter 38. The output signal from the multiplier 42 has the frequencies $nf_1$ and $f_2$.

In the bandpass filter 38, only the signal component with the frequency $f_2$ is selected to be transmitted to the output terminal 39. Thus, a local signal with the frequency $f_2$ can be obtained.

With the local oscillator system and the corresponding frequency switching method of the second embodiment, the same effects as those in the first embodiment can be obtained. Besides, there is an additional advantage that a circuit configuration of the local oscillator system is simpler than that of the first embodiment since only one frequency multiplier is required.

[Third Embodiment]

Figure 5:
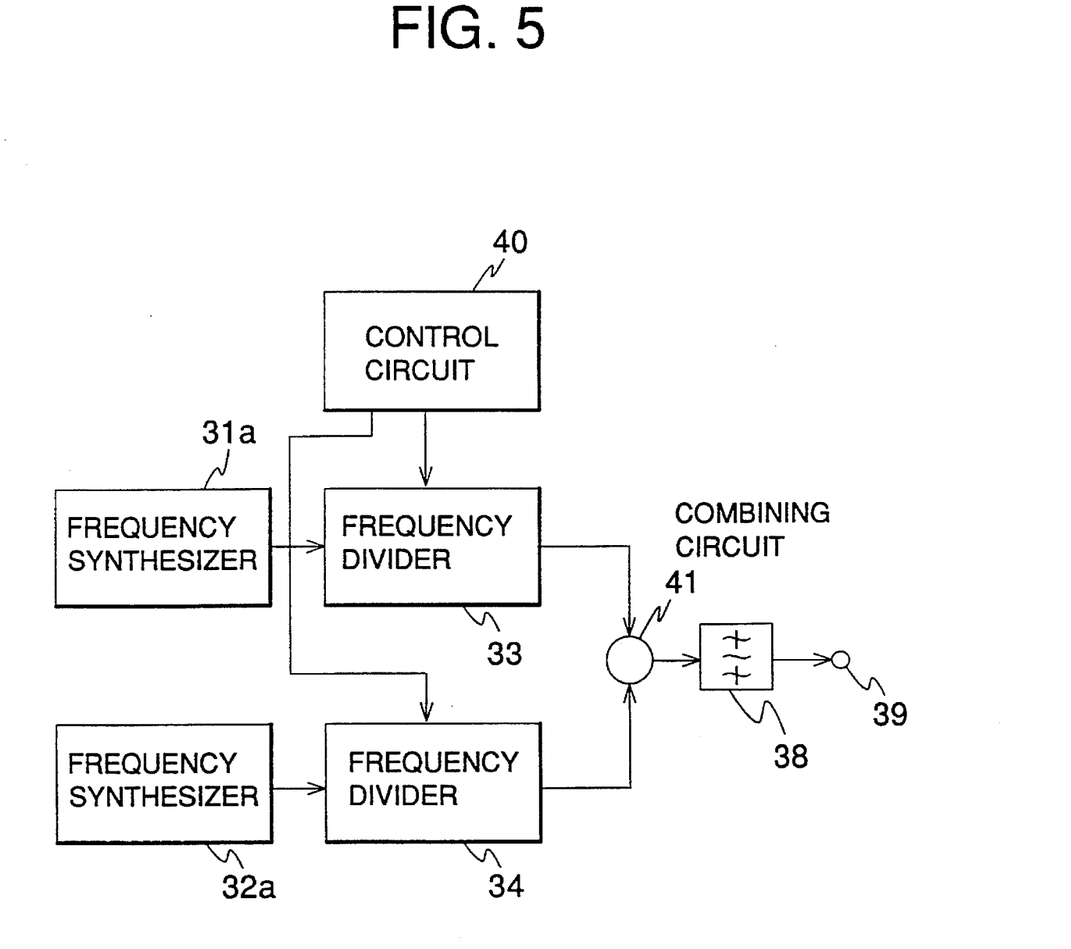
FIG. 5 is a functional block diagram of a local oscillator system according to a third embodiment of the present invention.

FIG. 5 shows a local oscillator system for an RF communication system according to a third embodiment of the present invention. This oscillator system is the same as those of the first and second embodiments except that no frequency multiplier is provided, and equivalent to those of the first and second embodiments in which m=1. Therefore, for the sake of simplification of explanation, the same reference numbers as those in FIG. 3 or 4 are attached to the corresponding elements in FIG. 5, and description about them is omitted.

In FIG. 5, a first PLL frequency synthesizer 31a generates a signal with a variable frequency $nf_1$ which is n times as much as a frequency $f_1$ to send it to the first frequency divider 33. A second PLL frequency synthesizer 32a generates a signal with a variable frequency $nf_2$ which is n times as much as a frequency $f_2$ to send it to the second frequency divider 34.

The first frequency divider 33 divides the frequency of the output signal with the frequency $nf_1$ from the first synthesizer 31a by a dividing factor n to generate an output signal with the frequency $f_1$ in the active operation mode. In the inactive operation mode, the divider 33 does not carry out the operation of frequency division, and the output signal with the frequency $nf_1$ is sent to the combining circuit 41 without frequency change.

Similarly, the second frequency divider 34 divides the frequency of the output signal with the frequency $nf_2$ from the second synthesizer 32a by the dividing factor n to generate an output signal with the frequency $f_2$ in the active operation mode. In the inactive operation mode, the divider 34 does not carry out the operation of frequency division, and the output signal with the frequency $nf_2$ is sent to the combining circuit 41 without frequency change.

The first and second frequency dividers 33 and 34 are controlled so that one of them is in the active operation mode while the other is in the inactive operation mode, similar to the first and second embodiments.

A combining circuit 41 combines the output signals from the first and second frequency dividers 33 and 34 with each other to form a single output signal including the components of both frequencies. Then, the single output signal is sent to the bandpass filter 38.

The first and second frequency dividers 33 and 34 are controlled so that one of them is in the active operation mode and the other is in the inactive operation mode, so that the output signal from the combining circuit 41 has the components with the frequency $f_1$ and $nf_2$ in one case, and with the frequencies $nf_1$ and $f_2$ in another case.

In the bandpass filter 38, the component with the frequency $f_1$ is selectively transmitted to the output terminal 39 as a local signal in one case. In another case, the component with the frequency $f_2$ is selectively transmitted to the output terminal 39 as a local signal.

A frequency switching method of the local oscillator system of the third embodiment is the same as those of the first and second embodiments except that no frequency multiplication is carried out.

With the local oscillator system and its frequency switching method of the third embodiment, the same effects as those in the first and second embodiments can be obtained. Besides, there is an additional advantage that a circuit configuration of the local oscillator system is simpler than that of the second embodiment since no frequency multiplier is required.

[Fourth Embodiment]

Figure 6:
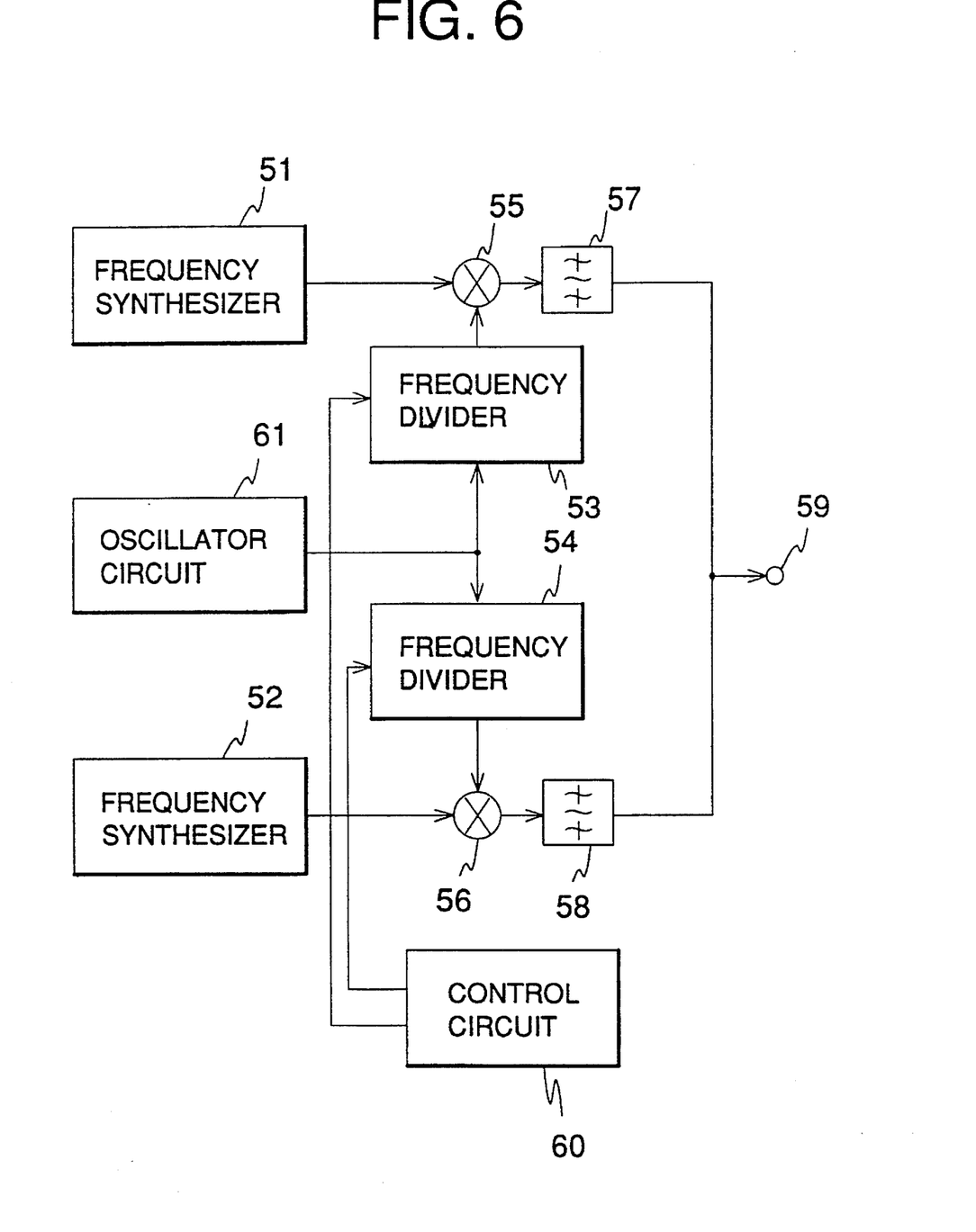
FIG. 6 is a functional block diagram of a local oscillator system according to a fourth embodiment of the present invention.

As shown in FIG. 6, a local oscillator system for an RF communication system according to a fourth embodiment of the present invention is composed of first and second PLL frequency synthesizers 51 and 52, an oscillator circuit 61, first and second frequency dividers 53 and 54, a control circuit 60 for controlling the first and second frequency dividers 53 and 54, first and second frequency multipliers 55 and 56, and first and second bandpass filters 57 and 58.

The first PLL frequency synthesizer 51 generates a signal with a variable frequency $f_1'$ and sends it to the first frequency multiplier 55. The second PLL frequency synthesizer 52 generates a signal with a variable frequency $f_2'$ and sends it to the second frequency multiplier 56. These frequencies $f_1'$ and $f_2'$ are different from each other and belong to the same band of frequencies.

The oscillator circuit 61 generates a signal with a fixed frequency $kf_0$ which is k times in value as much as a frequency $f_0$ to send it to both of the first and second frequency dividers 53 and 54, where k is an integer of two (2) or more.

The frequencies $f_1'$, $f_2'$ and $f_0$ have the following relationship. The sum or difference between the frequencies $f_1'$ and $f_0$ are equal in value to a local frequency, and the sum or difference between the frequencies $f_2'$ and $f_0$ are equal in value to another local frequency.

The first frequency divider 53 receives the output signal with the frequency $kf_0$ from the oscillator circuit 61 and divide the frequency of the output signal by a dividing factor k; then sends an output signal with the frequency $f_0$ thus obtained to the first frequency mixer 55. Similarly, the second frequency divider 55 receives the output signal with the frequency $kf_0$ from the oscillator circuit 61 and divides the frequency of the output signal by the same dividing factor k; then sends an output signal with the frequency $f_0$ thus obtained to the second frequency mixer 56.

The control circuit 60 controls the frequency dividers 53 and 54 so that one of the dividers 53 and 54 is operating and the other is not operating. Different from those in the first to third embodiments, the first or second divider 53 or 54 which is out of operation or stops operating does not output any signal to the corresponding one of the first and second frequency mixers 55 and 56.

The first frequency mixer 55 receives the output signal with the variable frequency $f_1'$ from the first synthesizer 51 and the output signal with the fixed frequency $f_0$ from the first divider 53, and then mixes the frequency of each of the output signals with each other to send a resultant mixed output signal to the first bandpass filter 57. Therefore, the output signal from the first frequency mixer 55 contains the components with the sum $(f_1'+f_0)$ and the difference $|f_1'-f_0|$ of the two frequencies $f_1'$ and $f_0$.

Similarly, the second frequency mixer 56 receives the output signal with the variable frequency $f_2'$ from the second synthesizer 52 and the output signal with the fixed frequency $f_0$ from the second divider 54, and mixes the frequency of each of the output signals with each other to send a resultant mixed output signal to the second bandpass filter 58. Therefore, the signal output from the second frequency mixer 56 contains the components with the sum $(f_2'+f_0)$ and the difference $|f_2'-f_0|$ of the two frequencies $f_2'$ and $f_0$.

The first bandpass filter 57 has a passband in which the component with the sum frequency $(f_1'+f_0)$ or the difference frequency $|f_1'-f_0|$ in the signal output from the first mixer 55 is selectively transmitted, so that one of the sum and difference frequencies is sent to an output terminal 59 as a local signal having a desired frequency.

Similarly, the second bandpass filter 58 has a passband in which the component with the sum frequency $(f_2'+f_0)$ or the difference frequency $|f_2'-f_0|$ in the signal output from the second mixer 56 is selectively transmitted, so that one of the sum and difference frequencies is sent to an output terminal 59 as a local signal having another desired frequency.

With the local oscillator system of the fourth embodiment, local frequency switching is carried out as follows:

First, when a local signal is taken out through the first filter 57, the first frequency divider 53 is put into operation by the control circuit 60, and the second frequency divider 54 does not operate.

The frequency of the signal with the fixed frequency $kf_0$ generated in the oscillator 61 is divided by k in the first frequency divider 53 to send a resulting frequency-divided signal to the first frequency mixer 55 with the frequency being changed to $f_0$. The first frequency mixer 55 mixes the frequency of the output signal with the frequency $f_0$ from the first divider 53 and that with the frequency $f_1'$ from the first synthesizer 51 with each other to generate an output signal containing the components with the sum frequency $(f_1'+f_0)$ and the difference frequency $|f_1'-f_0|$, which is sent to the first bandpass filter 57.

If the sum frequency $(f_1'+f_0)$ is equal to the local frequency, the first bandpass filter 57 selectively transmits the signal component with the sum frequency to the output terminal 59. If the difference frequency $|f_1'-f_0|$ is equal to the local frequency, it selectively transmits the signal component with the difference frequency to the output terminal 59.

Here, since the second frequency divider 54 is not put into operation, no signal is outputted from the second frequency divider 54. Therefore, only the output signal with the frequency $f_2'$ from the second frequency synthesizer 52 is inputted to the second frequency mixer 56. Then, the second frequency mixer 56 sends an output signal containing only the component with the frequency $f_2'$ to the second filter 58. The frequency $f_2'$ is outside of the passband of the filter 58, so that the output signal cannot pass through the filter 58, and as a result, no signal is outputted to the output terminal 59.

Thus, an output signal with a desired local frequency $(f_1'+f_0)$ or $|f_1'-f_0|$ can be obtained.

Similarly, when a local signal is taken out through the second filter 58, only the second frequency divider is put into operation by the control circuit 60.

The signal with the fixed frequency $kf_0$ generated in the oscillator 61 is divided by k in the second frequency divider 54 to send a resulting frequency-divided signal to the second frequency mixer 56 with the frequency being changed to $f_0$. The second frequency mixer 56 mixes the output signal with the frequency $f_0$ and that with the frequency $f_2'$ from the second synthesizer 52 with each other to generate an output signal containing the components with the sum frequency $(f_2'+f_0)$ and the difference frequency $|f_2'-f_0|$, which is sent to the second bandpass filter 58.

Similar to the first bandpass filter 57, the signal component with the sum frequency $(f_2'+f_0)$ or with the difference frequency $|f_2'-f_0|$ is selectively transmitted to the output terminal 59 as a local frequency.

Because no signal is outputted from the first frequency divider 53, no signal is outputted to the output terminal 59 through the first bandpass filter 57. Thus, an output signal with a local frequency $(f_2'+f_0)$ or $|f_2'-f_0|$ can be taken out from the terminal 59.

As described above, with the local oscillator system of the fourth embodiment, the spurious component is sent from the first or second frequency divider 53 or 54 which is not in operation. The frequency of the spurious component is $kf_0$ which is k times as much as that required for generating local frequencies, or $f_0$. Therefore, when the frequency $kf_0$ is mixed with the frequency $f_1'$ or $f_2'$ of the output signal from the first or second synthesizer 51 or 52 in the corresponding frequency mixer, its output frequency becomes $|f_1'\pm kf_0|$ or $|f_2'\pm kf_0|$. The frequencies $|f_1'\pm kf_0|$ and $|f_2'\pm kf_0|$ can be easily removed by the corresponding filter 57 or 58, respectively, by setting the respective passbands of the filters 57 and 58 so that the spurious frequencies $|f_1'\pm kf_0|$ and $|f_2'\pm kf_0|$ are outside of their passbands, respectively.

In FIG. 6, the output ends of the first and second filters 57 and 58 are connected directly to the output end 59, however, it is preferable that the output ends of the filters 57 and 58 are connected through a switch circuit composed of pin diodes or the like or a hybrid transformer.

With the local oscillator system and the associated frequency switching method of the fourth embodiment, the same effects as those in the first to third embodiments can be obtained.

In the first to fourth embodiments, two PLL frequency synthesizers are provided, however, three or more synthesizers and their related elements such as frequency dividers and filters may be provided as needed.

What is claimed is:

1. A local oscillator system for an RF communication system, comprising:

frequency generators for generating signals having different frequencies from each other;

frequency dividers respectively connected to said corresponding frequency generators to receive output signals from said corresponding frequency generators;

each of said frequency dividers having an active operation mode and an inactive operation mode, when in said active operation mode, each of said frequency dividers divides the frequency of said signal output from said corresponding frequency generator by a dividing factor n to output a resulting frequency-divided signal, and when in said inactive operation mode, each of said frequency dividers outputs said output signal without dividing the frequency of said output signal, wherein n is an integer equal to or greater than two;

control means for controlling said frequency dividers so that one of said frequency dividers is in said active operation mode while the remaining frequency dividers are in said inactive mode;

combining means for combining signals outputted from said frequency dividers to generate a single output signal; and a filter for selecting a component with a divided frequency from said single output signal output from said combining means, thereby obtaining a desired local signal at an output end of said filter.

2. A local oscillator system as claimed in claim 1, further comprising frequency multipliers provided between said respective frequency dividers and said combining means, each of said multipliers multiplying the frequency of each of said output signals output from said frequency dividers by a multiplication factor m and sending a resulting frequency-multiplied signal to said combining means, wherein m is an integer equal to or greater than two.

3. A local oscillator system as claimed in claim 1, further comprising a frequency multiplier provided between said combining means and said filter, said multiplier multiplying the frequency of said single output signal output from said combining means by a multiplication factor m and sending a resulting frequency-multiplied signal to said filter, wherein m is an integer equal to or greater than two.

4. A local oscillator system as claimed in claim 2, wherein said multiplication factor m is larger in value than said dividing factor n, and said filter removes signal components having frequencies equal to or less than (n/m) times he frequencies of the signals output from said frequency generators and signal components having frequencies equal to or greater than (2n/m) times the frequencies of the signals output from said frequency generators.

5. A local oscillator system as claimed in claim 3, wherein said multiplication factor m is larger in value than said dividing factor n, and said filter removes signal components having frequencies equal to or less than (n/m) times the frequencies of the signal output from said frequency generators and signal components having frequencies equal to or greater than (2n/m) times the frequencies of the signals output from said frequency generators.

6. A local oscillator system as claimed in claim 2, wherein said multiplication factor m is smaller in value than said dividing factor n, and said filter removes signal components having frequencies equal to or greater than (n/m) times the frequencies of the signals output from said frequency generators.

7. A local oscillator system as claimed in claim 3, wherein said multiplication factor m is smaller in value than said dividing factor n, and said filter removes signal components having frequencies equal to or greater than (n/m) times the frequencies of the signals output from said frequency generators.

8. A local oscillator system for an RF communication system, comprising:

an oscillator generating a first signal with a fixed frequency of k times as much as a given frequency, where k is an integer of two or more;

frequency dividers respectively connected to said oscillator, each of said frequency dividers receiving said first signal from said oscillator and dividing the frequency of said first signal by a dividing factor of k;

control means for controlling said frequency dividers so that one of said frequency dividers is operating while the remaining frequency dividers are not operating;

frequency generators for generating second signals, said second signals being different in frequency from each other;

frequency mixers, each of which mixes the frequency of an output signal output from a corresponding one of said frequency dividers with said second signal from a corresponding one of said frequency generators;

filters respectively connected to said frequency mixers, each of which selects a component with a desired local frequency from an output signal of a corresponding one of said frequency mixers; and an output terminal connected to said filters;

wherein said component with said desired local frequency is derived through one of said filters corresponding to an operating one of said frequency dividers.

9. A frequency switching method of a local oscillator system for an RF communication system, said method comprising the steps of:

generating signals having different frequencies;

dividing a frequency of one of said signals by a dividing factor n by controlling frequency dividers so that one of said frequency dividers is in an active operation mode and the remaining frequency dividers are in an inactive operation mode, wherein n is an integer equal to or greater than two;

combining a signal output from one of said frequency dividers which is in an active operation mode and at least one signal output from the remaining frequency dividers which are in an inactive operation mode, thereby generating a single output signal; and selecting a component with a frequency obtained through said dividing step from said single output signal as a local signal.

10. A frequency switching method as claimed in claim 9, further comprising the step of multiplying the frequency of the signal output from the one of the frequency dividers by a multiplication factor m before the combining step, wherein m is an integer equal or greater than two.

11. A frequency switching method as claimed in claim 9, further comprising the step of multiplying the frequency of the single output signal generated in the combining step by a multiplication factor m, wherein m is an integer equal or greater than two.

12. A frequency switching method as claimed in claim 10, wherein said multiplication factor m is larger in value than said dividing factor n, and the selecting step includes the step of removing from the single output signal, signal components having frequencies equal to or less than (n/m) times the frequencies of the signals generated in the generating step and signal components having frequencies equal to or greater than (2n/m) times the frequencies of the signals generated in the generating step.

13. A frequency switching method as claimed in claim 11, wherein said multiplication factor m is larger in value than said dividing factor n, and the selecting step includes the step of removing from the single output signal, signal components having frequencies equal to or less than (n/m) times the frequencies of the signals generated in the generating step and signal components having frequencies equal to or greater than (2n/m) times the frequencies of the signals generated in the generating step.

14. A frequency switching method of a local oscillator system comprising the steps of:

generating a first signal with a fixed frequency of k times as much as a given frequency, where k is an integer of two or more;

dividing the frequency of said first signal by a dividing factor k by using frequency dividers to output resulting frequency-divided signals, respectively, said frequency dividers being controlled so that one of said frequency dividers is in operation and the remaining frequency dividers are out of operation;

generating second signals with different frequencies;

mixing the frequency of one of said frequency-divided signals outputted from an operating one of said frequency dividers with the frequency of a corresponding one of said second signals; and selecting a component with a desired local frequency from an output signal generated in the mixing step;

wherein said component with said desired local frequency is derived through a filter provided for an operating one of said frequency dividers.

15. The local oscillator system of claim 1, wherein the filter comprises a bandpass filter being adapted to remove undesired components from said single output signal, the undesired signal components having frequencies corresponding to the frequencies of the signal output by the frequency divider that is in the inactive mode.

16. The local oscillator system of claim 1, wherein the filter comprises a bandpass filter being adapted to remove undesired components from said single output signal, the undesired signal components having frequencies corresponding to the frequencies of spurious components generated in the combining means so as to remove the spurious components from said single output signal.

17. The local oscillator system of claim 8, wherein the frequency dividers which are not operating do not output a signal.

18. The local oscillator system of claim 8, wherein the filters each comprise a passband filter adapted to remove undesired components having spurious frequencies equal to k times that required for generating local frequencies.

19. The method of claim 9, wherein the frequency dividers which are in the inactive mode output said signals without dividing the frequencies of said signals.

20. A frequency switching method comprising the steps of:

generating signals having different frequencies;

dividing a frequency of one of the signals by a dividing factor to produce a divided signal;

combining the divided signal with the other signals to generate a single output signal;

selecting from the single output signal a component having a frequency equal to a frequency obtained in the dividing step; wherein the step of dividing includes the step of controlling a plurality of frequency dividers so that one of the frequency dividers is in an active mode in which frequencies of input signals are divided and the remaining frequency dividers are in an inactive mode in which frequencies of input signals are not divided.

21. The method of claim 20, wherein the dividing factor is an integer equal to or greater than two.

22. A frequency switching method comprising the steps of:

generating a first signal having a fixed frequency of k times as much as a given frequency, where k is an integer equal to or greater than two;

dividing the frequency of the first signal by a dividing factor k to output a resulting frequency-divided signal;

generating second signals each having different frequencies from each other;

mixing the frequency of said frequency-divided signal with the frequency of one of the second signals to generate an output signal;

selecting a component with a desired local frequency from the output signal generated in the mixing step: wherein the step of dividing the frequency of the first signal includes the step of controlling a plurality of frequency dividers provided for said respective second signals so that one of said frequency dividers is in an active mode in which the frequency of said first signal is divided to output said frequency-divided signal while the remaining frequency dividers are in an inactive mode in which no signals are output.

23. The method of claim 22, wherein the step of selecting includes the step of selecting a component with the desired local frequency using a filter provided for one of said frequency dividers that is in the active mode.

\* \* \* \* \*